(12) United States Patent
Heaton et al.

(10) Patent No.: US 8,000,921 B2
(45) Date of Patent: Aug. 16, 2011

(54) METHOD AND APPARATUS FOR SYNCHRONIZING SIGNALS IN A TESTING SYSTEM

(75) Inventors: Dale A Heaton, Lucas, TX (US); Craig J Lambert, Plano, TX (US); Vanessa M Bodrero, Saint-Laurent-du-Var (FR); Alain C Chiari, Vence (FR)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/490,084

(22) Filed: Jun. 23, 2009

(65) Prior Publication Data

US 2009/0259430 A1 Oct. 15, 2009

Related U.S. Application Data

(62) Division of application No. 11/762,208, filed on Jun. 13, 2007, now Pat. No. 7,567,883, which is a division of application No. 10/766,073, filed on Jan. 28, 2004, now Pat. No. 7,246,025.

(51) Int. Cl.
*G01R 31/00* (2006.01)
(52) U.S. Cl. ............... 702/118; 324/76.53; 702/117; 714/738
(58) Field of Classification Search .......... 702/108, 702/117, 118, 121; 331/1 A, 1 R, 16, 18, 331/34; 324/76.53, 760; 714/100, 738
See application file for complete search history.

(56) References Cited

U.S. PATENT DOCUMENTS 6,859,028 B2 * 2/2005 Toner ................ 324/76.53
7,093,177 B2 * 8/2006 West et al. ............ 714/738

* cited by examiner

*Primary Examiner* — John H Le
(74) *Attorney, Agent, or Firm* — Yingsheng Tung; Wade J. Brady, III; Frederick J. Telecky, Jr.

(57) ABSTRACT

The preferred embodiments of the present invention provide approaches for synchronizing signals in a testing system. In some embodiments, the timing signal associated with each device under test (DUT) is maintained at an integer multiple of the tester timing signal. Additionally, in other embodiments, the timing signal associated with various DUTs is used as a timing reference for other devices.

4 Claims, 3 Drawing Sheets

METHOD AND APPARATUS FOR SYNCHRONIZING SIGNALS IN A TESTING SYSTEM

This application is a divisional of application Ser. No. 11/762,208 filed Jun. 13, 2007, which is a divisional of application Ser. No. 10/766,073 filed Jan. 28, 2004, now U.S. Pat. No. 7,246,025.

BACKGROUND OF THE INVENTION

1. Technical Field of the Invention

The present subject matter relates generally to testing integrated circuits and more particularly to improving measurement techniques for integrated circuits.

2. Background Information

The ubiquitous presence of integrated circuits (ICs) in almost every electronic device is testament to their importance in today's society. ICs are generally manufactured in wafer form, where multiple ICs are manufactured in an array using photolithography techniques. The ICs may be tested at various stages in the manufacturing process. For example, the ICs may be tested while they are in wafer form. The ICs also may be tested after they have been packaged by providing signals to the various pins of the package and examining the output pins.

One method of providing signals to the various pins of the package includes constructing an application specific circuit board for testing purposes, often called a "load board." The load board contains the IC to be tested, sometimes referred to as a device under test. FIG. 1 depicts a group of load boards 10A-C coupled to a tester 12. Load boards 10A-C include at least one device under test (DUT) 14A-C and oscillators 16A-C. Oscillators 16A-C are coupled to the DUTs 14A-C and provide a timing signal to each DUT 14A-C. Tester 12, which also includes an oscillator 18, is capable of performing various measurements on the DUTs 14A-C. The particular functionality of the various DUTs may determine the measurements taken by the tester 12. For example, some DUTs may contain radio-frequency (RF) functionality and therefore the tester 12 may measure the spectral content of signals generated by the DUTs. Furthermore, the measurements taken by the tester 12 may include sampling signals associated with the DUTs 14A-C at discrete instants of time.

FIG. 2 illustrates an exemplary signal 20 generated by any one of the DUTs 14A-C as well as a timing signal 22 generated by any one of the oscillators 16A-C. Timing signal 22 is shown as a digital signal having a high state and a low state. Signal 20 is shown as an analog signal having an active portion that corresponds with the high state of timing signal 22, and an inactive portion that corresponds with the low state of timing signal 22. Oscillator 18 provides tester 12 with a tester timing signal 24. In order to accurately measure signal 20, tester 12 samples signal 20 on the low-to-high transitions of the tester timing signal 24 as indicated by the upward facing arrows on timing signal 24. Measurement problems may arise if the sampling performed by tester 12 is not performed consistently during each sampling interval. For example during the high state $\phi_1$, signal 24 has one low-to-high transition, indicating one sampling of signal 20 during $\phi_1$. However during the high state $\phi_2$, signal 24 has no high-to-low transitions indicating that no sampling of signal 20 occurs during $\phi_2$. As a result, signal 20 may be sampled unevenly during successive sampling intervals causing measurement problems. Thus, a method and apparatus for synchronizing timing signals in a testing system is desirable.

BRIEF SUMMARY

A method and apparatus for synchronizing timing signals in a testing system is disclosed. In some embodiments, the timing signal associated with each device under test (DUT) is maintained at an integer multiple of the tester timing signal. Additionally, in other embodiments, the timing signal associated with various DUTs is used as a timing reference for other devices.

Notation and Nomenclature

Certain terms are used throughout the following description and claims to refer to particular system components. As one skilled in the art will appreciate, semiconductor companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices and connections. In addition, the term "synchronize" is intended to mean that two signals have frequencies that are substantially integer multiples of each other according to the equation: $n \cdot f_1 = m \cdot f_2$, where $f_1$, represents the frequency of a first signal and $f_2$ represents the frequency of a second signal and n and m are integer numbers. Furthermore, there may or may not be a static phase offset between two "synchronized" signals.

BRIEF DESCRIPTION OF THE DRAWINGS

For a more detailed description of the preferred embodiments of the present invention, reference will now be made to the accompanying drawings, wherein like components are indicated using like reference numbers.

DETAILED DESCRIPTION OF THE PREFERRED EMBODIMENTS

The following discussion is directed to various embodiments of the invention. Although one or more of these embodiments may be preferred, the embodiments disclosed should not be interpreted, or otherwise used, as limiting the scope of the disclosure, including the claims, unless otherwise specified. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1:
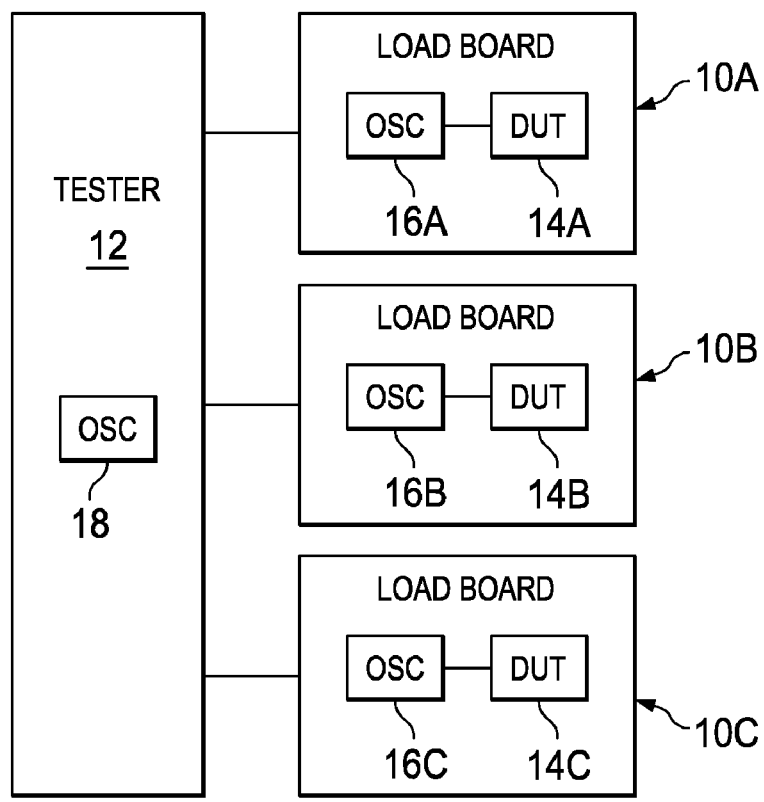
FIG. 1 depicts a testing system.
Figure 2:
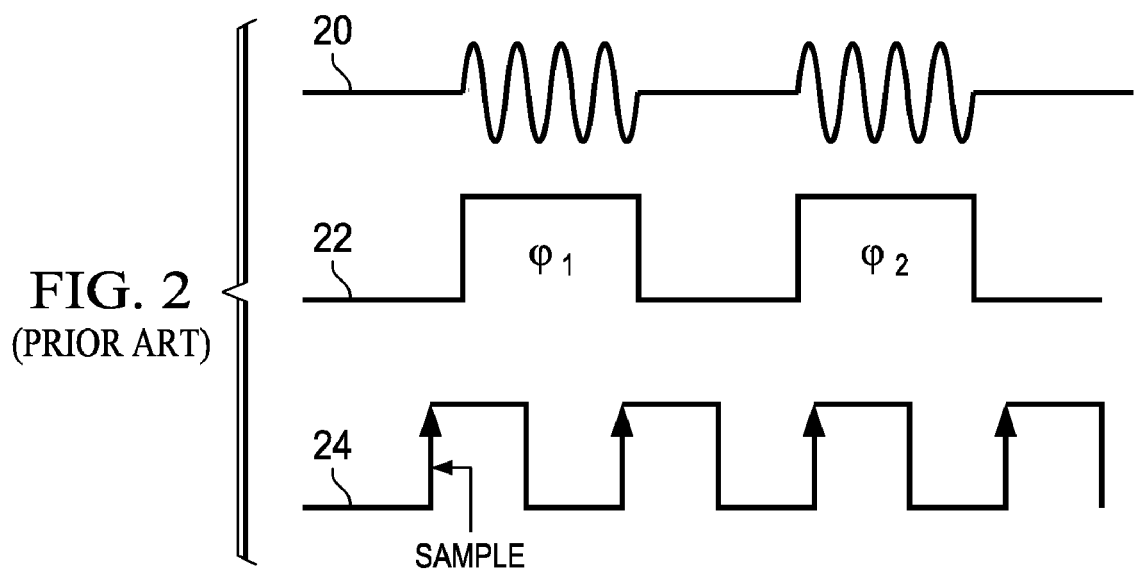
FIG. 2 illustrates representative signals used in testing ICs.
Figure 3A:
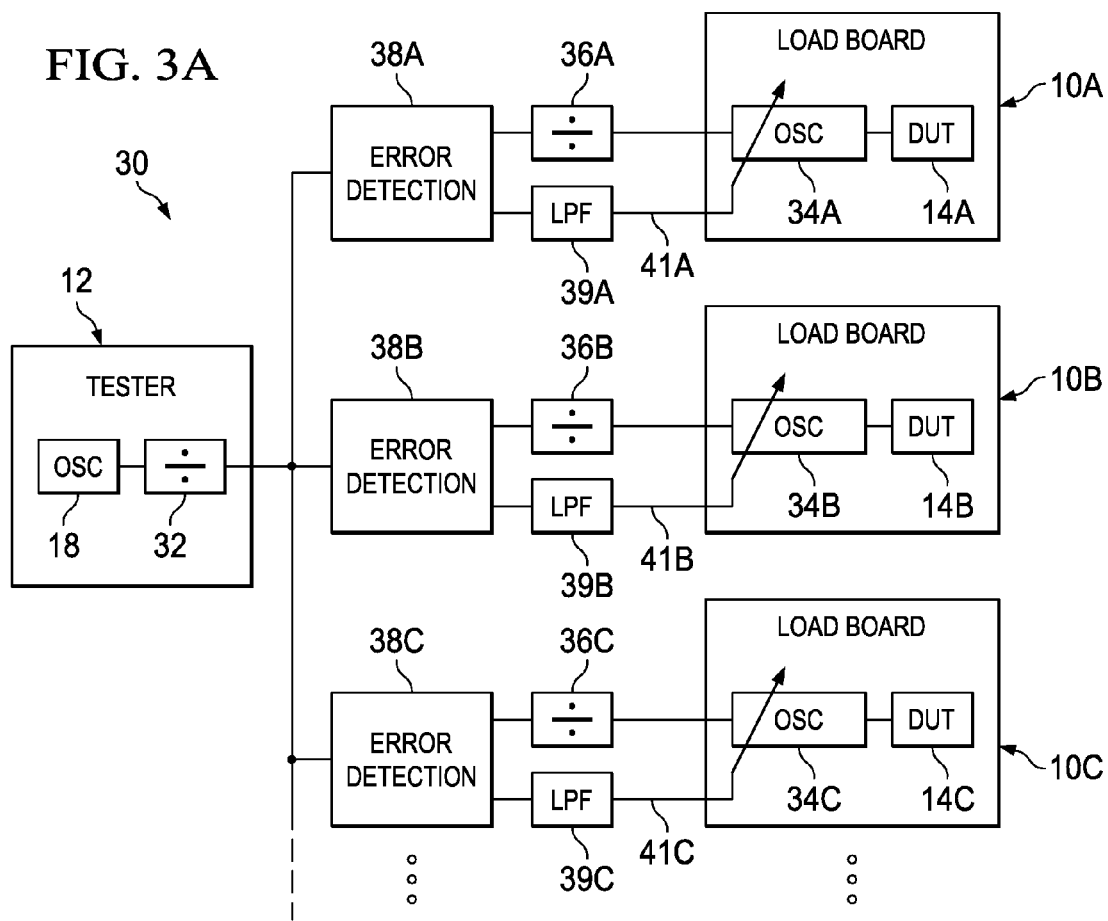
FIG. 3A illustrates an exemplary system for achieving synchronization.

FIG. 3A illustrates an exemplary system 30 for testing DUTs according to the preferred embodiments. System 30 includes the tester 12 that further includes the oscillator 18. Oscillator 18 is coupled to a divider 32 via tester 12. System 30 also includes load boards 10A-C comprising variable oscillators 34A-C and DUTs 14A-C. The variable oscillators 34A-C are preferably crystal-based oscillators that have relatively low phase noise and are coupled to dividers 36A-C and DUTs 14A-C. The oscillation frequency of variable oscillators 36A-C may be adjusted in many different ways. For example in some embodiments, variable oscillators 36A-C comprise voltage controlled oscillators, where the oscillation frequency is varied by varying a voltage provided to the variable oscillators 34A-C. Divider 32 and dividers 36A-C couple to error detectors 38A-C. Error detectors 38A-C are further coupled to low pass filters (LPFs) 39A-C. Error signals 41A-C, coming from LPFs 39A-C, couple to the variable oscillators 34A-C respectively. Divider 32 provides a frequency divided version of the timing signal from oscillator 18 to error detectors 38A-C. Likewise dividers 36A-C provide frequency divided versions of the timing signals from variable oscillators 34A-C to error detector 38A-C. The divide ratio of each divider in system 30 may be adjusted independently of each other. Preferably, dividers 36A-C and divider 32 provide common unit frequencies for the error detectors 38A-C to compare.

For example, assume a common unit frequency of 1 MHz is desired where the timing signal coming from oscillator 18 has a frequency of 13 MHz and the timing signal coming from variable oscillator 34A has a variable frequency of 10+/- 0.005 MHz. In this example, in order to provide a common unit frequency of 1 MHz to error detector 38A, divider 32 may be configured to divide by 13. Although the frequency coming from variable oscillator 34A may not be initially equal to 10 MHz (e.g., 9.95 MHz), the divider 36A may be configured to divide by 10. Therefore, the signal coming from divider 32 is 1 MHz and the signal coming from divider 36A is 0.995 MHz. Error signal 41A would then indicate the difference between these two frequencies (i.e., 0.005 MHz) and provide variable oscillator 34A with error signal 41A that is proportional to the difference between the two incoming signals. In this manner, the feedback loop formed by variable oscillator 34A, divider 36A, error detector 38A, and LPF 39A allows the oscillation frequency of the variable oscillator 34A to be synchronized with the oscillation frequency of the tester timing signal.

Figure 4:
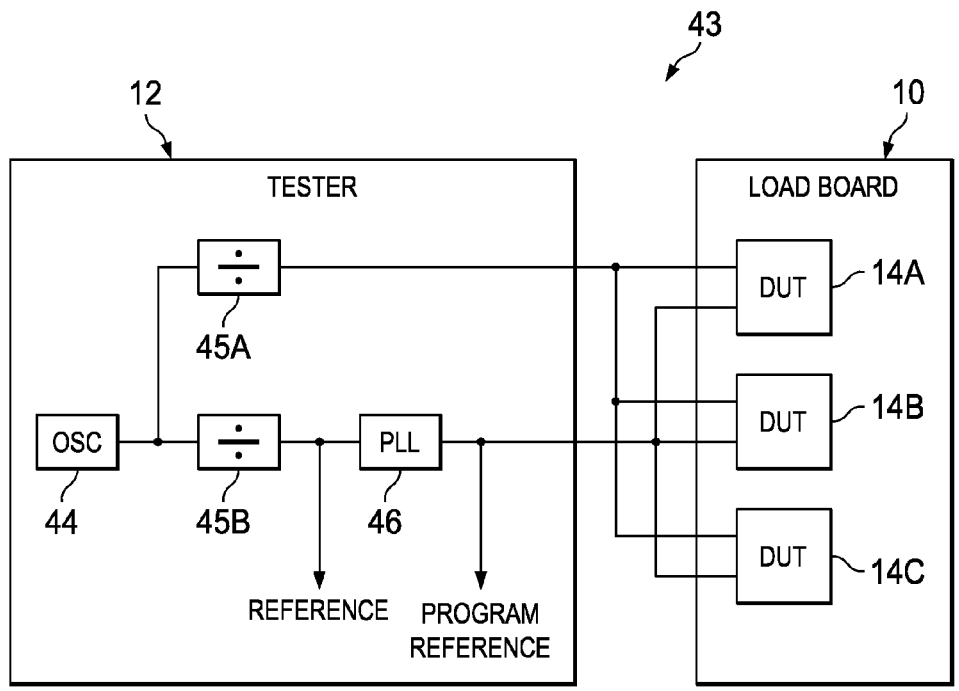
FIG. 4 illustrates another exemplary system for achieving synchronization.
Figure 5:
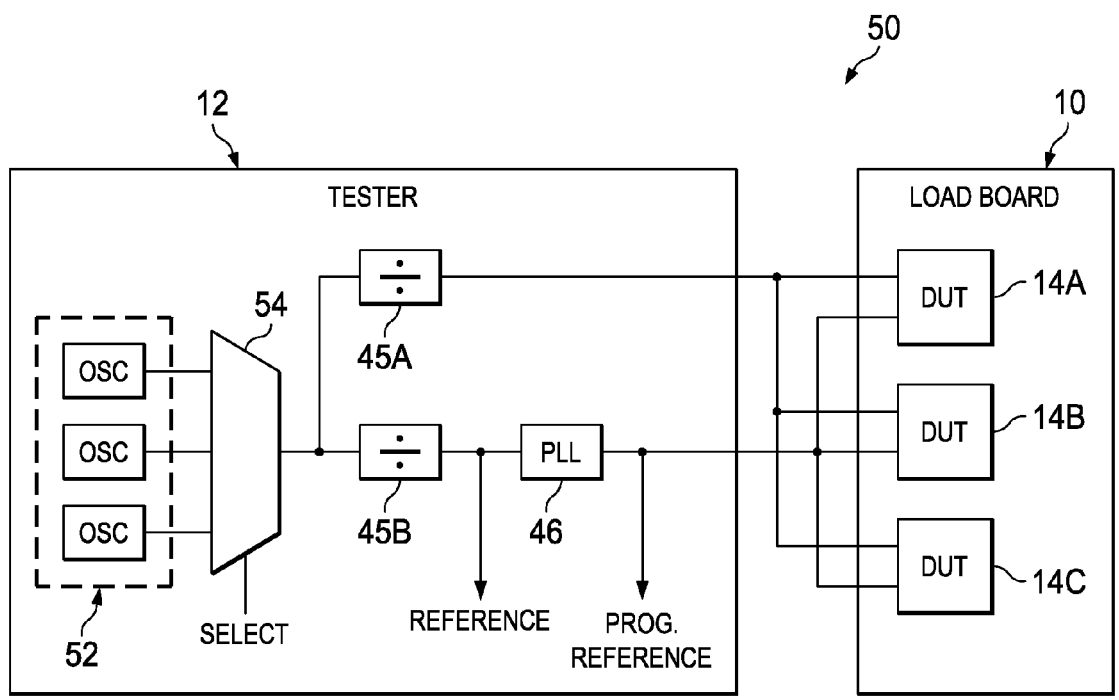
FIG. 5 illustrates yet another exemplary system for achieving synchronization.

Although system 30 depicts three load boards 10A-C, other numbers of load boards (i.e., one or more) are possible as is depicted in FIGS. 4 and 5. Also, although system 30 illustrates divider 32 implemented as a single divider, divider 32 may be implemented as multiple dividers coupled to the oscillator 18. Additionally, error detectors 38A-C preferably have linear transfer functions such that changes in the difference between the two frequencies provide linear output responses to variable oscillators 34A-C.

Figure 3B:
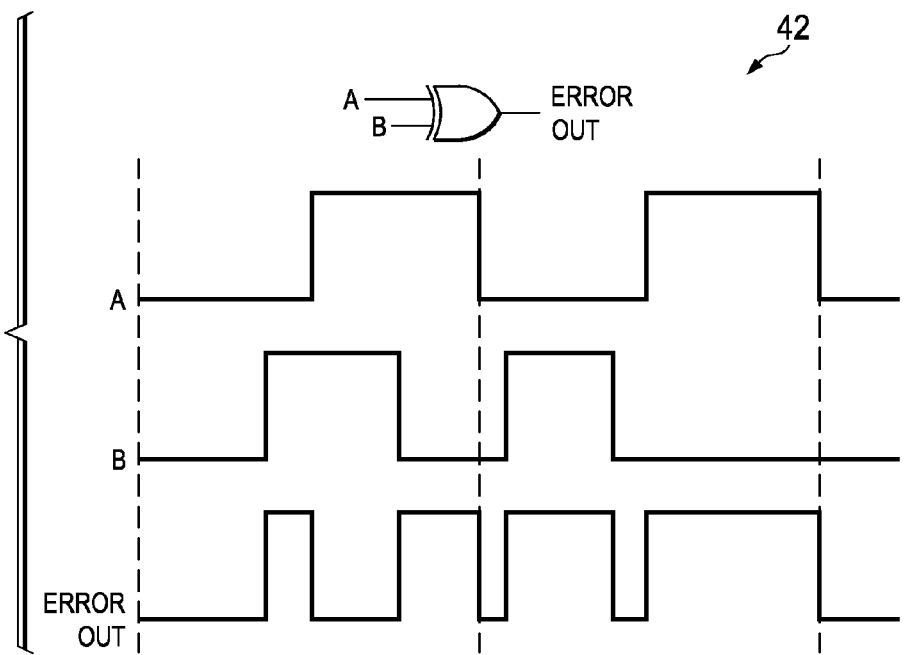
FIG. 3B illustrates an exemplary error detector.

FIG. 3B illustrates an exemplary error detector implemented as an XOR gate 42 along with an accompanying timing diagram. The XOR gate 42 has terminals A and B and an output signal ERROR OUT that is the difference between the signals at the A and B terminals. The ERROR OUT signal generated by the XOR gate 42 is in a low state when the signals present at the A and B terminals are the same (i.e., both low or both high), and the ERROR OUT signal is in a high state when the signals at the A and B terminals are different. Voltage values may be associated with the various digital states of ERROR OUT. For example, the low state may be associated with 0 volts whereas the high state may be associated with 2.5 volts. By coupling this voltage to a voltage controlled variable oscillator, the oscillation frequency of the variable oscillator can be adjusted. Further, this adjustable oscillation frequency may be implemented in a feedback loop to minimize the difference between the signals and synchronize the variable oscillators 34A-C to the oscillator 18. In this manner, the timing signal associated with oscillator 18 and the timing signal associated with oscillator 34A may be configured so that the two signals contain integer multiples of each other according to the equation $n \cdot f_1 = m \cdot f_2$, where n and m are integer numbers.

For example, if the timing signal associated with oscillator 18 is 13 MHz ($f_1$) and the timing signal associated with oscillator 34A has been adjusted (using the feedback provided by the error detector 38A) to be 10 MHz ($f_2$), then oscillator 18 will undergo 13 cycles in the time it takes variable oscillator 34A to undergo 10 cycles (i.e., n=10 and m=13.) Likewise, if the timing signal associated with oscillator 18 is not precisely 13 MHz, so that its divided down version provided to error detector 38A is not precisely 1 MHz, then the feedback loop comprising divider 36A, error detector 38A, LPF 39A, and variable oscillator 34A may adjust variable oscillator 34A so that its divided down version provided to error detector 38A is approximately equal to the divided down version from oscillator 18. Thus, the measurement problems associated with mismatched oscillation frequencies between the tester oscillator 18 and the frequencies associated with the DUTs 14A-C may be reduced by synchronizing the variable oscillators to the tester oscillator.

Although FIG. 3B illustrates one type of error detector, other error detectors are possible as described in pages 3-41 of "Monolithic Phase-Locked Loops and Clock Recovery Circuits-Theory and Design," by Behzad Razavi, which is incorporated herein by reference.

Referring again to FIG. 3A, the various load boards 10A-C are coupled to separate error detectors 38A-C and dividers 36A-C so that the various DUTs 14A-C may be configured with unequal oscillation frequencies from variable oscillators 34A-C, yet the oscillation frequency of each variable oscillator 34A-C may be individually locked to the oscillation frequency of oscillator 18 in the tester 12. This allows DUTs with individual timing requirements to be tested simultaneously. Also, the spectral purity requirements of each DUT may be accounted for by implementing each variable oscillator 34A-C as a crystal-based variable oscillator.

FIG. 4 illustrates another exemplary system 43 for testing DUTs 14A-C according to the preferred embodiments. System 43 includes the tester 12, an oscillator 44, dividers 45A-B, and a phase locked loop (PLL) 46. Oscillator 44 is coupled to divider 45A, which is further coupled to DUTs 14A-C on load board 10. Divider 45A therefore provides a divided down version of the signal coming from oscillator 44 to DUTs 14A-C. If oscillator 44 is a crystal based oscillator, then the amount of phase noise in the signals provided to the DUTs 14A-C may be minimized. Oscillator 44 is also coupled to divider 45B, which is further coupled to PLL 46. The PLL 46 is capable of performing frequency synthesis on incoming signals to produce a wide range of frequencies, and providing this synthesized frequency to the DUTs 14A-C. In this manner, each DUT receives a divided down version of an oscillator signal (i.e., the signal from divider 45A), as well as receiving a synthesized version of the oscillator signal. Accordingly, system 43 is capable of providing for a wide variety of frequency needs.

For example, assume that oscillator 44 is a crystal based oscillator with a frequency of 260 MHz. Divider 45A may be configured to divide by 10 so that 26 MHz is provided to DUTs 14A-C. Divider 45B may be configured to divide by 26 to provide a 10 MHz signal to PLL 46. In addition, the 10 MHz signal may be used as a low phase noise reference to other internal or external devices (not shown) as indicated by the arrow in FIG. 4. The PLL 46 synthesizes the 10 MHz signal coming from divider 45B into a wide range of frequencies, e.g., 1 kHz to 800 MHz. The wide range of synthesized frequencies generated by the PLL 46 is provided to DUTs 14A-C. DUTs 14A-C receive the low phase noise 26 MHz signal from divider 45A as well as receiving a desired synthesized frequency from PLL 46 (which may contain greater phase noise.) This synthesized signal from the PLL 46 is also available as a programmable reference to other internal or external devices (not shown) as indicated by the arrow in FIG. 4. Thus, system 43 is capable of providing frequencies for both the devices within system 43 and the devices external to system 43 (i.e., digitizer, arbitrary waveform generator, and digital capture device.)

FIG. 5 illustrates another exemplary system 50 for testing DUTs 14A-C according to the preferred embodiments. System 50 comprises the tester 12 including a plurality of oscillators 52 coupled to a multiplexer 54. Multiplexer 54 is further coupled to dividers 45A-B, where divider 45A couples to DUTs 14A-C and divider 45B couples to a PLL 46. Dividers 45A-B and PLL 46 in system 50 operate similar to the operation described above with regard to system 43. In addition, divided down signal from divider 45B is capable of being used as an internal and external reference, and the synthesized signal from PLL 46 is also capable of being used as an internal or external reference. Multiplexer 54 includes a SELECT line that is preferably controlled by the tester 12. By configuring the SELECT line, tester 12 may choose from among the various timing signals provided by the plurality of oscillators 52 and synchronize the timing signals used in the tester to the timing signals used for the DUTs 14A-C. For example, the plurality of oscillators may include 260 MHz and 160 MHz oscillators. Tester 12 may then configure the SELECT line to choose between the 260 MHz oscillator and the 160 MHz oscillator. Since tester 12 is capable of supplying a variety of timing signals to the various DUTs 14A-C that are synchronized with the timing signals of the tester 12.

While the preferred embodiments of the present invention have been shown and described, modifications thereof can be made by one skilled in the art without departing from the spirit and teachings of the invention. The embodiments described herein are exemplary only, and are not intended to be limiting. Many variations and modifications of the invention disclosed herein are possible and are within the scope of the invention. For example, although some embodiments may reduce the phase offsets between timing signals, correcting for phase offsets is not required as part of the synchronization process. Further, although the embodiments refers to testing a certain number of DUTs, in practice testing any desired number of DUTs is possible. Accordingly, the scope of protection is not limited by the description set out above. Each and every claim is incorporated into the specification as an embodiment of the present invention.

What is claimed is:

1. A testing system, comprising:
   a load board including at least one device under test (DUT) and at least one oscillator; and
   a tester including:
   an oscillator having an oscillation frequency;
   a first divider coupled between the oscillator and the at least one DUT; wherein the oscillation frequency of the oscillator $f_1$ and an output frequency from the first divider $f_2$ are synchronized according to the equation $n \cdot f_1 = m \cdot f_2$, where n and m are integer numbers;
   a second divider coupled to the oscillator, wherein the first and second dividers have different divide ratios; and
   a phase locked loop (PLL) coupled between the second divider and the at least one DUT.

2. The testing system of claim 1, wherein the frequency from the first divider divided version of the oscillation frequency to the at least one DUT.

3. The testing system of claim 1, wherein the PLL provides a synthesized version of the oscillation frequency to the at least one DUT.

4. The testing system of claim 1, wherein the frequency from the oscillator of the tester and a frequency from the at least one oscillator of the load board are provided as references to external devices.

* * * * *